United States Patent [19]

Cole

[11] Patent Number: 4,506,169
[45] Date of Patent: Mar. 19, 1985

[54] PEAK AMPLITUDE DETECTOR

[75] Inventor: William A. Cole, Putnam, Canada

[73] Assignee: Linear Technology Inc., Burlington, Canada

[21] Appl. No.: 351,567

[22] Filed: Feb. 23, 1982

[51] Int. Cl.³ ..................... H03K 5/22; H03K 5/153; H03K 17/00
[52] U.S. Cl. .................................... 307/351; 307/359; 328/150
[58] Field of Search ............... 307/350, 351, 352, 358, 307/359; 328/150, 151, 146; 330/257, 288

[56] References Cited

U.S. PATENT DOCUMENTS

| | | | |
|---|---|---|---|
| 3,309,618 | 3/1967 | Harris et al. | 330/69 |
| 3,624,410 | 11/1971 | Bruckert | 307/358 |
| 3,702,942 | 11/1972 | Aquive | 307/352 |
| 3,757,138 | 9/1973 | Bhatia et al. | 307/350 |
| 4,401,950 | 8/1983 | Davis | 330/257 |

Primary Examiner—Stanley D. Miller
Assistant Examiner—Timothy P. Callahan
Attorney, Agent, or Firm—Rogers, Bereskin & Parr

[57] ABSTRACT

An electronic device for generating a signal indicative of the peak magnitude of an alternating voltage signal is described. The device includes a voltage-to-current converter that generates a current signal comprising a quiescent current and an alternating current signal which varies directly with the alternating voltage signal. A current sink absorbs the current signal up to a controllable maximum current level. A charge current is generated when the current signal exceeds the maximum current level, and is delivered to a capacitor. Feedback circuitry varies the maximum current level of the current sink directly with the resulting capacitor voltage. The capacitor voltage is consequently indicative of the peak magnitude of the alternating voltage signal. A discharge current is applied to the capacitor so that the capacitor voltage can decrease in response to a decrease in the peak magnitude of the alternating voltage signal.

12 Claims, 3 Drawing Figures

PEAK AMPLITUDE DETECTOR

FIELD OF THE INVENTION

The invention relates to devices for measuring the peak amplitude of an alternating voltage signal.

BACKGROUND OF THE INVENTION

Devices for measuring peak signal levels are commonly used in hearing aid amplifiers, which require some measure of automatic gain control (AGC). In such applications, the magnitude of amplified acoustic signals is constantly monitored, and amplifier gain varied to maintain signal levels within the operating range of the amplifier. The devices of the present invention were specifically developed for use in hearing aid amplifiers; however, the devices can be used in many practical applications calling for the generation of a signal indicative of the peak magnitude of an alternating voltage signal.

In a preferred embodiment of the detector described more fully below, the general design object was to provide a peak magnitude detector that could be manufactured as part of an integrated circuit hearing aid amplifier (except for components such as capacitors), and that could be operated from a supply voltage in the order of one volt. In the past, such hearing aid amplifiers have employed peak level detectors (or half-wave rectifiers performing an analogous function) responsive only to excursions of a particular polarity in the amplified signal. The particular embodiment described below is responsive to both positive and negative excursions of an amplified signal and is consequently less subject to the transients and distortion characteristic of half-cycle operation. Additionally, it was an object to provide this preferred embodiment with a well-defined detection threshold which would eliminate detection of low level signals falling in a prescribed magnitude range.

BRIEF SUMMARY OF THE INVENTION

In a first aspect, the invention provides a device for producing a signal indicative of the peak magnitude of an alternating voltage signal. The device includes current signal generating means that generate a current signal having a peak in magnitude corresponding to each peak of a first polarity in the magnitude of the alternating voltage signal. Each peak in the current signal varies directly in magnitude with the corresponding peak in the alternating voltage signal. Current sink means sink the current signal up to a controllable maximum current level. Charge current generating means produce a charge current when the current signal exceeds the maximum current level, and deliver the charge current to a capacitor. Feedback means vary the maximum current level of the current sink means directly in magnitude with the resultant capacitor voltage whereby the capacitor voltage tends to be indicative of the peak magnitude of the alternating voltage signal. Discharge current generating means apply a discharge current to the capacitor so that the capacitor voltage can decrease in response in a decrease in the peak magnitude of the alternating voltage signal.

In a second aspect, the invention provides a device for producing a signal indicative of the peak magnitude of an alternating voltage signal, which device is responsive to both positive and negative excursions of the alternating voltage signal. The device includes current signal generating means for generating first and second unipolar current signals. The first current signal has a peak corresponding to each peak of a first polarity in the magnitude of the alternating voltage signal, and the second current has a peak corresponding to each peak of a second polarity in the magnitude of the alternating voltage signal. Each of the peaks in the first and second current signals vary directly in magnitude with the corresponding peak in the alternating voltage signal. Current sink means are adapted to sink the first current signal up to a first controllable maximum current level and the second current signal up to a second controllable maximum current level. Charge current generating means produce a charge current when either the first current signal exceeds the first maximum current level or the second current signal exceeds the second maximum current level, and the charge current is delivered to a capacitor. Feedback means vary each of the first and second maximum current levels of the current sink means directly in magnitude with the resulting capacitor voltage whereby the capacitor voltage tends to be indicative of the peak magnitude of the alternating voltage signal. Discharge current generating means apply a discharge current to the capacitors so that the capacitor voltage can be increased in response to a decrease in the peak magnitude of the alternating voltage signal.

The terms "current sink" or "current sink means" as used in the disclosure and appended claims should be understood as a reference to a device or devices capable of absorbing a current delivered by another device or of delivering the current drawn by another device. In either event, the operation of the current sink or current sink means will be described as the "sinking" of a current.

DESCRIPTION OF THE DRAWINGS

The invention will be better understood with a reference to drawings, in which.

DESCRIPTION OF PREFERRED EMBODIMENTS

Figure 1:
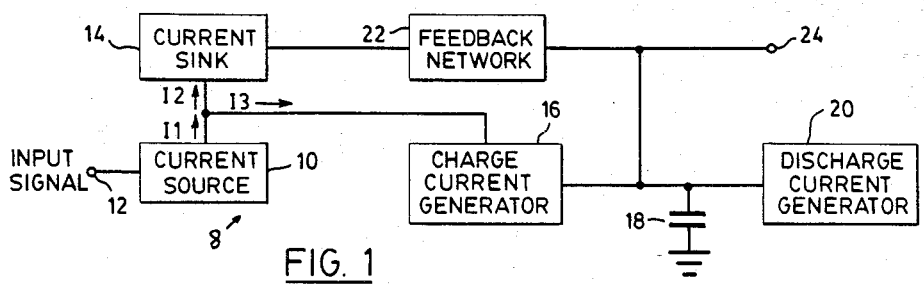
FIG. 1 is a block diagram representation of a half-wave rectifier embodying the invention.

Reference is made to FIG. 1 which is a block diagram representation of a peak level detector 8 embodying the invention. The detector 8 comprises a current source 10 responsive to an alternating voltage signal received at an input terminal 12, a current sink 14, a charge current generator 16, and a capacitor 18 for receiving the charge current, a discharge current generator 20, and feedback circuitry 22.

The current source 10 generates a unipolar current signal $I_1$, that is, a current signal having a single polarity. The current signal $I_1$ preferably comprises a quiescent current of predetermined magnitude, and a current signal component varying directly in magnitude with the input signal, whereby the current signal $I_1$ has a peak corresponding to each peak of a first polarity in the input signal. Peaks of an opposite polarity in the input signal will tend to produce minimum values in the current signal $I_1$. The signal component is preferably linearly related to the input signal, although such a requirement is not strictly necessary. All that is required is that the peaks and the current signal $I_1$ vary directly in magnitude with the corresponding peaks in the input signal so that the current peaks will in fact be indicative of the peak value of the input signal. The term "varying directly in magnitude" must consequently be understood as implying a unique one-to-one relationship between the relevant magnitudes, with the relevant magnitudes increasing and decreasing together. In typical applications, the current source 10 may be a conventional voltage-to-current converter.

The current sink 14 is conditioned to absorb the current signal $I_1$ up to a controllable maximum current level. The current absorbed is indicated as $I_2$ in FIG. 1. The excess current which is indicated as $I_3$ is detected by the charge current generator 16 which responds by delivering a charge current to the capacitor 18. The charge current is preferably generated by amplification of the excess current so that the magnitude of the charge current varies with the discrepancy between the current generated by the current source 10 and the current sunk. However, such a relationship between the excess current and the charge current is not strictly necessary for the purposes of the invention, because of the feedback arrangement involved.

The feedback circuitry 22 detects the capacitor voltage, and increases or decreases the maximum current sunk by the current sink 14 directly with the capacitor voltage. While the capacitor 18 continues to charge, the feedback circuitry 22 continues to increase the maximum current level of the current sink 14 until all of the current $I_1$ is being absorbed. If the excess current $I_3$ is amplified to generate the charge current then in steady state not all of the current $I_1$ will be sunk as a charge current must be generated to balance the discharge current applied to the capacitor 18.

In steady state, the current sink 14 is effectively conditioned to sink the peak current signal generated by the current source 10. This peak occurs when the input signal has a first polarity, the peak of the opposite polarity not being detected. Because of this feedback arrangement, the capacitor voltage is indicative of the peak value of the input signal (and would be indicative of the RMS value of a sinusoidal input signal). The capacitor voltage is made available at the output terminal 24.

It will be appreciated from the description of operation that the exact form of the current signal $I_1$ is not critical, the only requirement being the correspondence between peak values of the current $I_1$ and those of the input signal, described above.

The peak level detector 8 does not react immediately to a drop in the level of the input signal. The discharge means 20 must first reduce the capacitor voltage to a level at which the current sink 14 is conditioned to just sink the peak current generated by the current source 10 in response to the new input signal. It will be apparent that the nature of the discharge current applied to the capacitor 18 will affect the manner in which the peak level detector 8 responds to a decreasing input signal. A constant current of predetermined magnitude is preferred, the magnitude being appropriately selected for particular applications, but a more elaborate mechanism could be provided.

Figure 2:
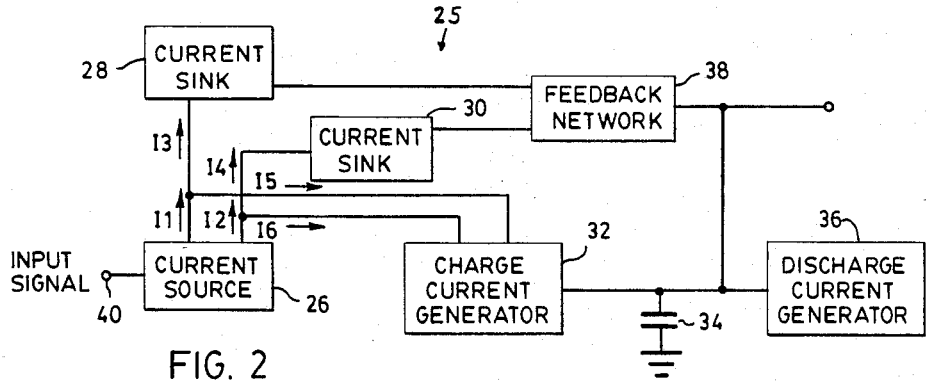
FIG. 2 is a block diagram representation of a full-wave rectifier embodying the invention; and, FIG. 3 is a circuit diagram illustrating a preferred embodiment of a full-wave rectifier constructed according to the invention.

FIG. 2 is a block diagram representation of a peak level detector 25 embodying the invention. The full-wave rectifier comprises a current source 26, a pair of current sinks 28, 30, a charge current generator 32, a capacitor 34, discharge current generating means 36 and feedback circuitry 38. The operation of the detector 25 is similar to that of the detector 8 except that the detector 25 is responsive to both positive and negative excursion of an alternating voltage signal.

The current source 26 generates two unipolar current signals $I_1$, $I_2$. The current $I_1$ comprises a signal component varying directly in magnitude with the input signal received at an input terminal 40 which signal component increases the magnitude of the current signal $I_1$ to a maximum level when the input signal has a first polarity. The current signal $I_2$ contains a similar signal component, but one which increases the magnitude of the current $I_2$ to a maximum level when the input signal has an opposite polarity.

The current sinks 28, 30 absorb portions of the currents $I_1$, $I_2$ up to first and second maximum levels respectively, these currents sunk being designated $I_3$ and $I_4$, leaving excess currents $I_5$, $I_6$. When either current $I_5$ or $I_6$ is detected, the charge current generator 32 delivers a charge current to the capacitor 34. The feedback network 38 increases the first and second maximum current levels of the sinks 28, 30 until the excess currents drop to substantially zero. At this point the capacitor voltage will reflect the peak magnitude of an alternating input signal. The discharge current generator 36 serves to drop the capacitor voltage in a controlled fashion to ensure that the peak level detector 25 can follow input signals of decreasing magnitude.

Figure 3:
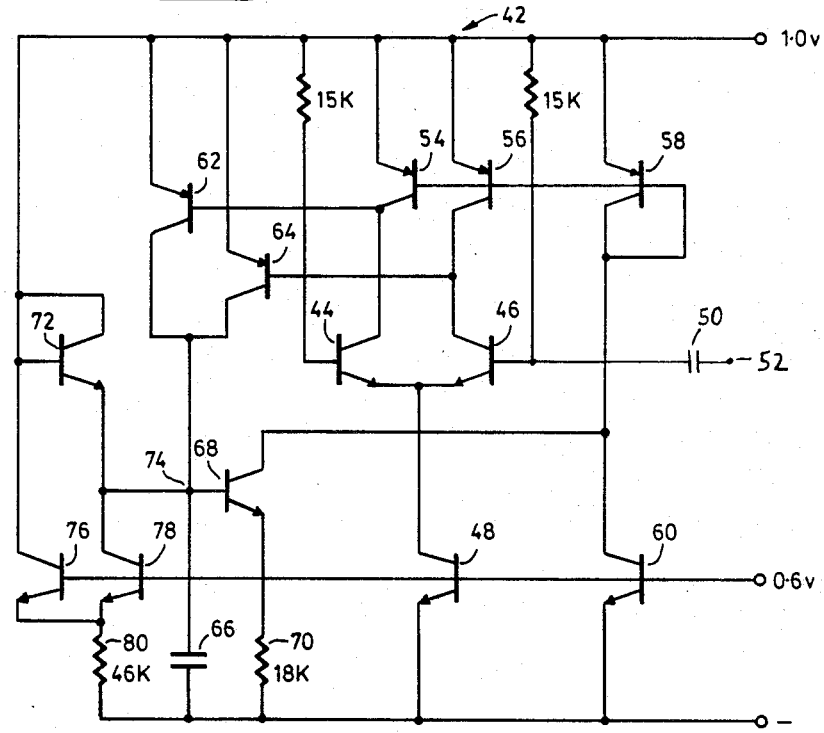

FIG. 3 illustrates a practical embodiment 42 of a peak level detector constructed according to the invention. The particular detector 42 was designed specifically for AGC applications in hearing aid amplifiers (but can be used in other applications as well). The detector 42 operates from a one volt power supply. With capacitive components provided by an end user, the circuit configuration lends itself to manufacture in integrated circuit form.

A differential pair of bipolar junction transistors (BJT's) 44, 46 serves as a voltage-to-current converter. Currents are drawn through the differential pair 44, 46 by the transistor 48 which is a current source biased by a 0.6 volt reference signal. The base of the transistor 46 is coupled by a capacitor 50 to an input terminal 52 where an alternating input voltage signal can be received. The capacitor 50 serves to remove DC components from the input signal.

Transistors 54, 56 (BJT's) are active loads which serve as controlled current sinks for sinking currents generated by the differential pair. As used in this specification and the appended claims, the term "active load" should be understood as a transistor conditioned to conduct a current whose maximum level varies in response to a control signal applied to a control terminal of the device, which control terminal might be the gate of a field effect transistor or the base of a BJT. In the detector 42 the transistors 54, 56 will normally be operating in saturation, with the currents conducted by the transistors 54, 56 determined by the currents drawn by the differential pair and by the maximum current levels set by the signals applied to their bases. The latter signals will determine when the active loads come out of saturation, at which point the active loads will begin to act substantially as constant current sources. The excess currents required by the differential pair 44, 46 must then be provided elsewhere.

The bases of the transistors 54, 56 are joined to provide a common control terminal. The transistors 54, 56 are matched in a conventional manner to have similar characteristics, and are additionally matched with a diode-configured transistor 58 in a current mirror arrangement. A transistor 60 acting as a constant current source biased from the 0.6 volt references causes a quiescent current of magnitude I to flow in the transistor 58, and consequently conditions the transistors 54, 56 to each sink a minimum current I. The base terminal of the current source transistor 48 is connected to that of the current source transistor 60 so that both are biased by the same 0.6 volt reference signal. The junction surface areas of the transistor 48 are formed 1.7 times larger than those of the corresponding transistor 60, and transistor 48 is consequently biased to draw a current of magnitude 1.7I, which produces quiescent currents of 0.85I in each of the transistors 44, 46. The effect of this arrangement is to produce a very precise detection threshold which eliminates the detection of low level signals. The detection threshold is determined entirely by the ratio of the currents which transistors 48, 60 are biased to draw. Assuming that the capacitor voltage is low, and that no input signal has as yet been applied, only quiescent currents of 0.85I are drawn through each of the transistors 44, 46. The emitter-collector voltage of each of the transistors 54, 56 consequently drops to about 0.1–0.3 volts, each of the transistors 54, 56 being biased in the saturation region of its operation. Since the transistors 54, 56 are conditioned to sink the minimum current of I, no current will be available as base drive for the transistors 62, 64 until an input signal raises the currents of the differential pair by about 10%. This occurs at an input voltage V given by the following expression (determined from well-known formulae respecting operation of a BJT differential pair):

$$V = \frac{2kT}{q} \ln = 5.5 \text{ millivolts peak} = 3.4 \text{ millivolts RMS}$$

where,
  k is Boltzman's constant
  q is a unit charge, and
  T is assumed to be room temperature (293° K.)

It will be appreciated that by varying the matching of the transistors 48, 60 during manufacture, various, relatively precise thresholds can be provided.

The transistors 62, 64 serve as current amplifiers. Any current signal generated in the collector of transistor 46 which is not sunk by the transistor 56 is applied to the base of the transistor 64 and amplified. Similarly, any current signal generated in the collector of the transistor 44 which is not sunk by the transistor 54 is delivered to the base of the transistor 62 and amplified. The charge currents are generated in the collectors of the transistors 62, 64 which are connected together and coupled to the capacitor 66.

A transistor 68 and resistor 70 provide feedback to regulate the sinking of current by the active load transistors 54, 56. The transistor 68 generates a current signal in response to the voltage drop across the capacitor 66 (which capacitor voltage is applied across the base-emitter junction of the transistor 68 and across the resistor 70). This current signal, which is generated in the collector of the transistor 68 is applied to the collector of the diode configured transistor 58. This increased current flow in the transistor 58 is mirrored in the transistors 54, 56. Consequently, as the capacitor voltage increases, the active load transistors 54, 56 are conditioned to sink larger currents.

A diode-configured transistor 72 connected between the one volt supply and at the point 74 serves as a voltage clamp. The transistor 72 ensures that the voltage drop across the capacitor 66 never drops below about 0.4 volts (that is, the supply voltage less about 0.6 volts which represent the approximate turn-on voltage of the diode-connected transistor 72). This ensures that the detector 42 can react quickly when an input signal rises suddenly from a non-detectable level to a relatively large level. It would be appreciated that this minimum capacitor voltage is insufficient to produce any significant current flow in the feedback transistor 68 and consequently will not affect detection threshold voltages in any significant way.

Transistors 76, 78 together with resistor 80 constitute a current source which draws a discharge current of about 200 microamperes from the capacitor 66. This discharge current is delivered by the collector of the transistor 78, which transistor receives base drive from the 0.6 volt reference. The transistor 76 is formed with junction surface areas approximately 12 fold larger than the corresponding surface areas in the transistor 78, receives base drive from the same 0.6 volt reference signal, and consequently delivers a significantly larger current to the resistor 80. This arrangement permits a relatively small discharge current to be delivered by the transistor 78 without requiring the resistor 80 to be unduly large, which facilitates integrated circuit construction.

An alternating voltage signal received at the input terminal 52 is not detected or rectified until it exceeds the predetermined threshold value. When the threshold is exceeded, the transistors 54, 56 are not biased to sink all of the current signals generated in the collectors of the differential pair, 44, 46, and the excess currents are delivered to the base terminals of the transistors 62, 64. Positive excursions of the input signal cause the transistor 64 to generate a charge current while negative-going excursions cause the transistor 62 to generate a charge current. The charge currents increase the capacitor voltage from the 0.4 volt minimum, and the increase in capacitor voltage is effectively fed back via the feedback transistor 68 to condition the active load transistors 54, 56 to sink larger currents. The capacitor voltage rises until each of the active load transistors 54, 56 is conditioned to sink the maximum current signal generated in the respective transistors 44, 46. At this point, the capacitor voltage reflects the peak magnitude of the input signal. The discharge current generator (namely, the transistors 76, 78 and resistor 80) tends to discharge the capacitor 66 to ensure that input signals of decreasing magnitude can be tracked.

The resistor 70 affects the magnitude of the gain between the capacitor voltage and the input signal. The transfer function between the peak magnitude of the input signal and the capacitor voltage is non-linear with gain increasing in substantially exponential fashion with increasing signal voltage. More linear transfer functions can be obtained by reducing the magnitude of the resistor 70 or by adding resistors in series with the emitter junctions of the differential pair of transistors 44, 46. For the purposes of the invention, however, the magnitude of the capacitor voltage need not be linearly related to the peak voltage of the input signal; all that is required is that the capacitor voltage and the peak magnitude of the input signal be related in a unique one-to-one relationship.

It will be apparent that the major source of voltage drops between the power supply lines of the detector 42 will be the base-emitter voltages (at turn-on) of the various transistors. It will be apparent from a closer review of the circuit that in any pathway extending between the power supply lines only one such base-emitter voltage drop can occur. The result is that the detector 42 can operate from a 1.0 volt supply. To the best of the inventor's knowledge this represents a marked advance over prior detectors.

It will be appreciated that the detector 42 is a particular embodiment of the invention, and that many modifications of a workshop nature may be made by a skilled circuit designer in the embodiment detailed without departing from the scope or spirit of the invention.

I claim:

1. A device for producing a signal indicative of the peak magnitude of an alternating voltage signal, comprising:
    current signal generating means responsive to the alternating voltage signal for generating a unipolar current signal having a peak in magnitude corresponding to each peak of a first polarity in the magnitude of the alternating voltage signal, each of the peaks in the magnitude of the current signal varying directly in magnitude with the corresponding peak in the alternating voltage signal;
    transistor current sink means connected in series with said current signal generating means for sinking the unipolar current signal up to a controllable maximum current level;
    charge current generating means for generating a charge current when the unipolar current signal exceeds the maximum current level;
    a capacitor connected to the charge current generating means to receive the charge current;
    feedback means responsive to the voltage drop across the capacitor for varying the maximum current level of the current sink means directly in magnitude with the voltage drop across the capacitor whereby the voltage drop across the capacitor tends to be indicative of the peak magnitude of the alternating voltage signal; and,
    discharge current generating means for applying a substantially continuous discharge current to the capacitor so that the voltage drop across the capacitor can decrease in response to a decrease in the peak magnitude of the alternating voltage signal.

2. A device as claimed in claim 1 in which the charge unipolar current generating means receive the excess of the unipolar current signal over the maximum current and amplify the excess of the current over the maximum current to generate the charge current.

3. A device as claimed in claim 1 or 2 in which the feedback means set a predetermined minimum level for the controllable maximum current level of the current sink means whereby the voltage drop across the capacitor tends not to increase when the peak magnitude of the alternating voltage signal is below a predetermined threshold level.

4. A device as claimed in claim 1 or 2 in which the current signal generating means comprises means for generating a quiescent current of substantially predetermined constant magnitude and for generating an alternating current signal varying substantially directly in magnitude with the alternating voltage signal, said quiescent current and said alternating signal in combination forming said unipolar current signal.

5. A device for producing a signal indicative of the peak magnitude of an alternating voltage signal, comprising:
    current signal generating means responsive to the alternating voltage signal for generating a first unipolar current signal whose magnitude has a peak corresponding to each peak of a first polarity in the magnitude of the alternating voltage signal and a second unipolar current signal whose magnitude has a peak corresponding to each peak of a second polarity in the magnitude of the alternating voltage signal, each of the peaks in the magnitudes of the first and second current signals varying directly in magnitude with the corresponding peak in the magnitude of the alternating voltage signal;
    first transistor current sink means for sinking said first unipolar current signal up to a first controllable maximum current level and second transistor current sink means for sinking said second unipolar current signal up to a second controllable maximum current level;
    charge current generating means for generating a charge current when the first unipolar current signal exceeds the first maximum current level or when the second unipolar current signal exceeds the second maximum current level;
    a capacitor connected to the charge current generating means to receive the charge current;
    feedback means responsive to the voltage drop across the capacitor for varying each of first and second maximum current levels of the current sink means directly in magnitude with the voltage drop across the capacitor whereby the voltage drop across the capacitor tends to be indicative of the peak magnitude of the alternating voltage signal; and,
    discharge current generating means for applying a substantially continuous discharge current to the capacitor so that the voltage drop across the capacitor can decrease in response to a decrease in the peak magnitude of the alternating voltage signal.

6. A device as claimed in claim 4 in which said charge current generating means receive and amplify the excess of each of the first and second unipolar current signals over respectively the first and second maximum current levels sunk by the first and second current sinks.

7. A device as claimed in claim 4 in which the feedback means set a predetermined minimum level for each of the first and second variable maximum current levels whereby the voltage drop across the capacitor tends not to increase when the general magnitude of the alternating voltage signal is below a predetermined threshold level.

8. A device as claimed in claim 4 or 5 in which the current signal generating means comprises means for generating a first quiescent current of substantially constant predetermined magnitude and a first alternating current varying substantially directly in magnitude with the alternating voltage signal, said first quiescent current and said first alternating signal in combination forming said first unipolar current signal, said current signal generating means further comprising means for generating a second quiescent current of substantially constant predetermined magnitude and a second alternating current varying substantially directly in magnitude with said alternating voltage signal, said second quiescent current and said second alternating signal in combination forming said second unipolar current signal.

9. A device as claimed in claim 5 in which:

the current signal generating means comprise a differential transistor pair including first and second transistors for generating the first and second unipolar current signals respectively, the first unipolar current signal comprising a first quiescent current of substantially constant magnitude and a first alternating current signal varying substantially directly in magnitude with the alternating voltage signal whereby the first unipolar current signal has a peak in magnitude corresponding to each peak of a first polarity in the alternating voltage signal, the second unipolar current signal comprising a second quiescent current of substantially constant magnitude and a second alternating current signal varying substantially directly in magnitude with the alternating voltage signal whereby the second unipolar current signal has a peak in magnitude corresponding to each peak of a second polarity in the alternating voltage signal; and, the current sink means comprise a first active load connected to the first transistor to sink the first unipolar current signal, and a second active load connected to the second transistor to the sink the second unipolar current signal, each of the first and second active loads having a control terminal coupled to the feedback means whereby the first and second active loads are controlled by the feedback means to sink the first and second unipolar current signals up to the first and second maximum current levels.

10. A device as claimed in claim 9 in which:

the control terminal of the first and second active loads are connected together to provide a common control terminal the feedback means comprise bias means for normally biasing the active loads in the saturation region of their operation when the capacitor voltage is below a predetermined threshold.

11. A device as claimed in claim 10 in which the feedback means comprise a diode connected to the common control terminal and bias current generating means responsive to the capacitor voltage for drawing a biasing current through the diode, the bias current generating means comprising means for generating a quiescent current of predetermined magnitude and a further current which varies with the magnitude of the capacitor voltage, said quiescent current and said further current together forming said biasing current.

12. A device as claimed in claim 11 in which:

the active loads and the diode are substantially matched transistors:

the bias current generating means include a first current source transistor biased by a reference voltage to draw the quiescent current of the biasing current through the diode; and, the differential pair includes a second current source transistor biased by the reference voltage to draw the quiescent currents of the differential pair through the differential pair, the second current source transistor being adapted to draw a current less than twice the quiescent current drawn by the first current source transistor, whereby, only input signals with a magnitude in excess of a threshold voltage cause an increase in the capacitor voltage.

* * * * *